US006974733B2

(12) United States Patent
Boyanov et al.

(10) Patent No.: US 6,974,733 B2
(45) Date of Patent: Dec. 13, 2005

(54) DOUBLE-GATE TRANSISTOR WITH ENHANCED CARRIER MOBILITY

(75) Inventors: Boyan Boyanov, Portland, OR (US); Brian Doyle, Portland, OR (US); Jack Kavalieros, Portland, OR (US); Anand Murthy, Portland, OR (US); Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/463,080

(22) Filed: Jun. 16, 2003

(65) Prior Publication Data

US 2004/0253774 A1 Dec. 16, 2004

(51) Int. Cl.[7] .............................................. H01L 21/338
(52) U.S. Cl. ....................... 438/176; 438/285; 438/173; 257/190; 257/201; 257/192
(58) Field of Search ................................ 438/176, 285, 438/192, 173; 257–265; 257/190, 192, 201, 280, 314–324

(56) References Cited

U.S. PATENT DOCUMENTS

| 5,534,713 | A | * | 7/1996 | Ismail et al. ................... 257/24 |
| 5,714,777 | A | * | 2/1998 | Ismail et al. ................. 257/263 |
| 6,071,784 | A | * | 6/2000 | Mehta et al. ............... 438/303 |
| 6,319,799 | B1 | * | 11/2001 | Ouyang et al. ............. 438/528 |
| 6,657,252 | B2 | * | 12/2003 | Fried et al. .................. 257/316 |
| 6,703,271 | B2 | * | 3/2004 | Yeo et al. ................... 438/221 |
| 6,855,990 | B2 | * | 2/2005 | Yeo et al. ................... 257/353 |
| 2002/0079507 | A1 | | 6/2002 | Shim et al. |
| 2002/0098657 | A1 | * | 7/2002 | Alavi et al. ................. 438/283 |
| 2002/0140031 | A1 | | 10/2002 | Rim |
| 2002/0167048 | A1 | | 11/2002 | Tweet et al. |
| 2003/0111686 | A1 | * | 6/2003 | Nowak ........................ 257/328 |
| 2004/0157353 | A1 | * | 8/2004 | Ouyang et al. ............... 438/38 |

OTHER PUBLICATIONS

Ouyang, Q. C., et al., "Built–in Longitudinal Field Effects in Sub–100–nm Graded $Si_{1-z}Ge_z$ Channel PMOSFETs" *IEEE Trans. on Electron Devices*, vol. 48, No. 6, Jun. 2001, pp. 1245–1250, XP001082184.

Date, C.K., et al., "Increased Hot–Carrier Effects Using SiGe Layers in Vertical Surrounding–Gate MOSFETs", *IEEE Trans. on Electron Devices*, vol. 48, No. 12, Dec. 2001 pp., 2690–2964, XP001077646.

Date, C.K., et al., "Suppression of the Floating–Body Effect Using SiGe Layers in Vertical Surrounding–Gate MOSFETs", *IEEE Trans. on Electron Devices*, vol. 48, No. 12, Dec. 2001, pp. 2684–2689, XP00177645.

Collaert, N., et al., "Modeling the Short–Channel Threshold Voltage of a Novel Vertical Heterojunction of pMOSFET", *IEEE Trans. on Electron Devices*, vol. 46, No. 5, May 1999, pp. 933–939, XP000928589.

Liu, K.C., et al., "A Novel Sidewall Strained–Si Channel nMOSFET", Electron Devices Mtg, 199, IEDM Technical Digest, *IEEE*, Dec. 5, 1999 pp. 63–66 XP010372015.

Int'l Search Report mailed Aug. 18, 2004 in co–pending Int'l Application No. PCT/US03/40582, 8 pages.

\* cited by examiner

*Primary Examiner*—Caridad Everhart
(74) *Attorney, Agent, or Firm*—Blakely, Sokoloff, Taylor and Zafman (57) ABSTRACT

There is disclosed an apparatus including a straining substrate, a device over the substrate including a channel, wherein the straining substrate strains the device in a direction substantially perpendicular to a direction of current flow in the channel.

20 Claims, 7 Drawing Sheets

DOUBLE-GATE TRANSISTOR WITH ENHANCED CARRIER MOBILITY

FIELD

Circuit devices and the manufacture and structure of circuit devices.

BACKGROUND

Increased performance of circuit devices on a substrate (e.g., integrated circuit (IC) transistors, resistors, capacitors, etc. on a semiconductor (e.g., silicon) substrate) is usually a major factor considered during design, manufacture, and operation of those devices. For example, during design and manufacture or forming of, metal oxide semiconductor (MOS) transistor semiconductor devices, such as those used in a complementary metal oxide semiconductor (CMOS), it is often desired to increase movement of electrons in N-type MOS device (NMOS) channels and to increase movement of positive charged holes in P-type MOS device (PMOS) channels.

U.S. Pat. No. 6,335,233 discloses a first conductive impurity ion that is implanted into a semiconductor substrate to form a well area on which a gate electrode is formed. A first non-conductive impurity is implanted into the well area on both sides of the gate electrode to control a substrate defect therein and to form a first precipitate area to a first depth. A second conductive impurity ion is implanted into the well area on both sides of the gate electrode, so that a source/drain area is formed to a second depth being relatively shallower than the first depth. A second non-conductive impurity is implanted into the source/drain area so as to control a substrate defect therein and to form a second precipitate area.

U.S. Pat. No. 6,365,472 discloses a semiconductor device that includes a lightly doped drain (LDD) structure MOS transistor wherein the formation of defects due to ion implantation at the edge of the side wall of the gate electrode is suppressed. In order to perform the ion implantation for forming the source and drain regions of the MOS transistor, impurity ions are implanted using the first and second side walls provided to the gate electrode as a mask, and then the heat treatment for impurity activation is performed after removing the second side wall near the source and drain regions doped with high-concentration impurity ions. By removing the second side wall prior to the heat treatment, the stress applied to the edges of the high-concentration impurity doped regions in an amorphous state is decreased.

U.S. Pat. No. 6,395,621 discloses a process with which amorphous silicon or polysilicon is deposited on a semiconductor substrate. Then, a low-temperature solid phase growth method is employed to selectively form amorphous silicon or polysilicon into single crystal silicon on only an exposed portion of the semiconductor substrate.

U.S. Pat. No. 6,455,364 discloses a method for fabricating a semiconductor device in which, a collector layer of a first conductivity type is formed in a region of a semiconductor substrate sandwiched by device isolation. A collector opening is formed through a first insulating layer deposited on the semiconductor substrate so that the range of the collector opening covers the collector layer and part of the device isolation. A semiconductor layer of a second conductivity type as an external base is formed on a portion of the semiconductor substrate located inside the collector opening, while junction leak prevention layers of the same conductivity type as the external base are formed in the semiconductor substrate.

U.S. Pat. No. 6,455,871 discloses a method for fabricating a SiGe device using a metal oxide film. There is disclosed growing a silicon buffer layer and a SiGe buffer layer on a silicon substrate by low-temperature process, so that defects caused by the mismatch of the lattice constants being applied to the epitaxial layer from the silicon substrate are constrained in the buffer layered formed by the low-temperature process.

U.S. Pat. No. 6,465,283 discloses a structure and fabrication method using latch-up implantation to improve latch-up immunity in CMOS circuit.

U.S. Patent Application Publication Number 2002/0140031 discloses a strained silicon on insulator (SOI) structure and a method for its fabrication, in which a strained silicon layer lies directly on an insulator layer, contrary to the prior requirement for strained-Si layers to lie directly on a strain-inducing (e.g., SiGe) layer. The method generally entails forming a silicon layer on a strain-inducing layer so as to form a multilayer structure, in which the strain-inducing layer has a different lattice constant than silicon so that the silicon layer is strained as a result of the lattice mismatch with the strain-inducing layer. The multilayer structure is then bonded to a substrate so that an insulating layer is between the strained silicon layer and the substrate, and so that the strained silicon layer directly contacts the insulating layer. The strain-inducing layer is then removed to expose a surface of the strained silicon layer and yield a strained silicon-on-insulator structure that comprises the substrate, the insulating layer on the substrate, and the strained silicon layer on the insulating layer.

BRIEF DESCRIPTION OF THE DRAWINGS

Various features, aspects, and advantages will become more thoroughly apparent from the following detailed description, appended claims, and accompanying drawings in which:

DETAILED DESCRIPTION

Figure 1:
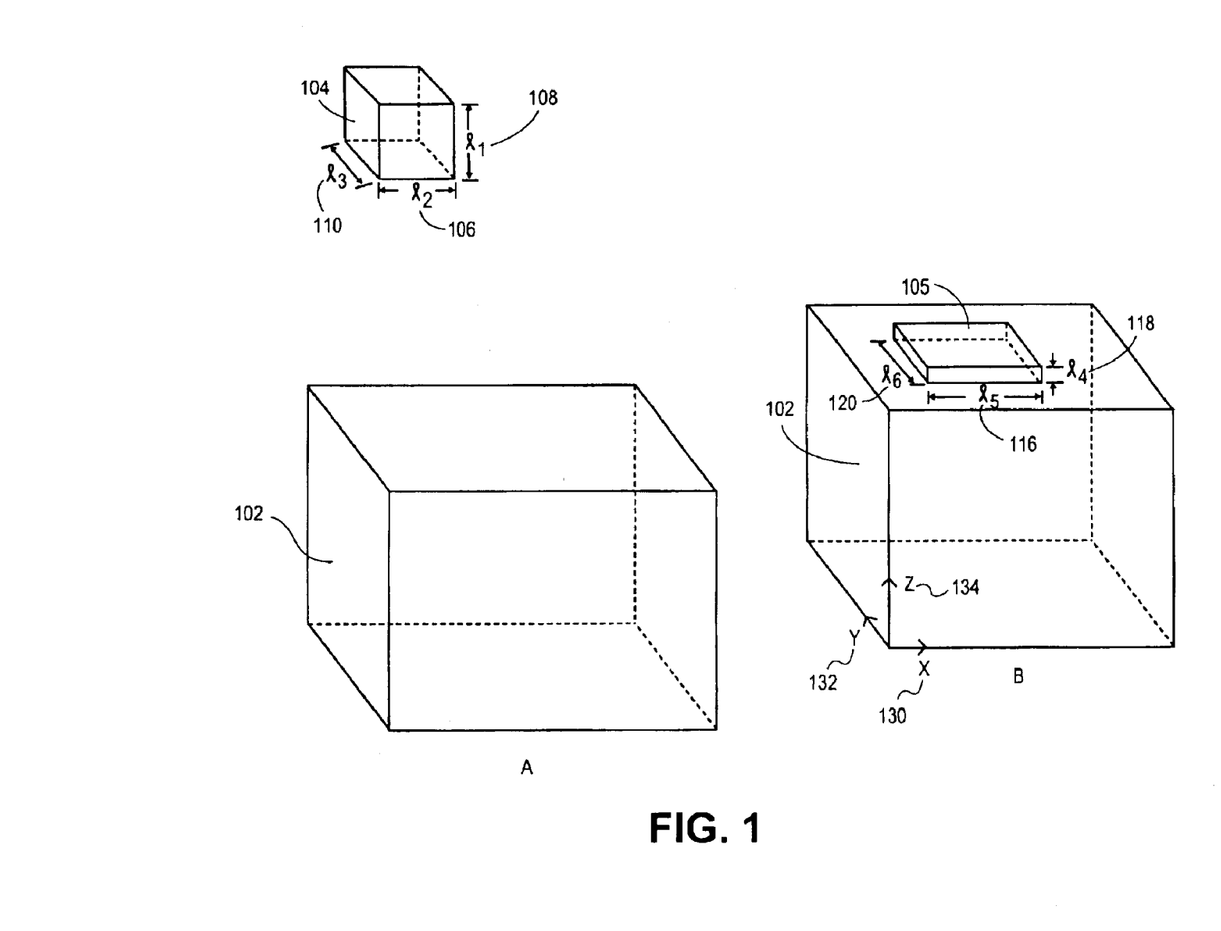
FIG. 1 is a view of a portion of a bulk material and a portion of a small material.

FIG. 1 at "A" shows bulk material 102 having a large lattice constant, and small material 104 having a smaller lattice constant than bulk material 102. Small material 104 has first dimension L1 108, second dimension L2 106, and third dimension L3 110.

In one embodiment, bulk material 102 is silicon germanium (SiGe) with 50% silicon and 50% germanium, and small material 104 is silicon (Si), where bulk material 102 has a lattice constant 2% greater than the lattice constant of small material 104.

FIG. 1 at "B" shows bulk material 102, and small material 105 after it has been brought into contact or bonded with bulk material 102. The small lattice constant of small material 105 has been strained by the larger lattice constant of bulk material 102. Distance L2 106 has been strained (lengthened) to distance L5 116, distance L3 110 has been strained to distance L6 120. In addition, distance L1 108 has been compressed to distance L4 118 due to the Poisson's ratio of small material 105. (The appearance of small material 105 has been exaggerated in order to show the effects of the strain.)

In one embodiment, where bulk material 102 is SiGe with 50% Si and 50% Ge, and small material 105 is Si, distance L5 116 is 2% greater than distance L2 106, and distance L6 120 is 2% greater than distance L3 110. Assuming a Poisson's ratio for small material 105 of 0.17, then distance L4 118 will be 0.34% smaller than distance L1 108.

Strained small material 105 could be used, for example, in an NMOS transistor channel region, where the electrons could flow in the X 130 direction, or the Y 132 direction, where the electron flow would be improved in strained small material 105 in the X 130 and Y 132 directions as compared to small material 104, which has not been strained. Alternatively, strained small material 105 could be used, for example, in a PMOS transistor channel region, for improved hole-flow in the Z direction 134, since the Z direction 134 has been strained from distance L1 108 to smaller distance L4 118.

Figure 2:
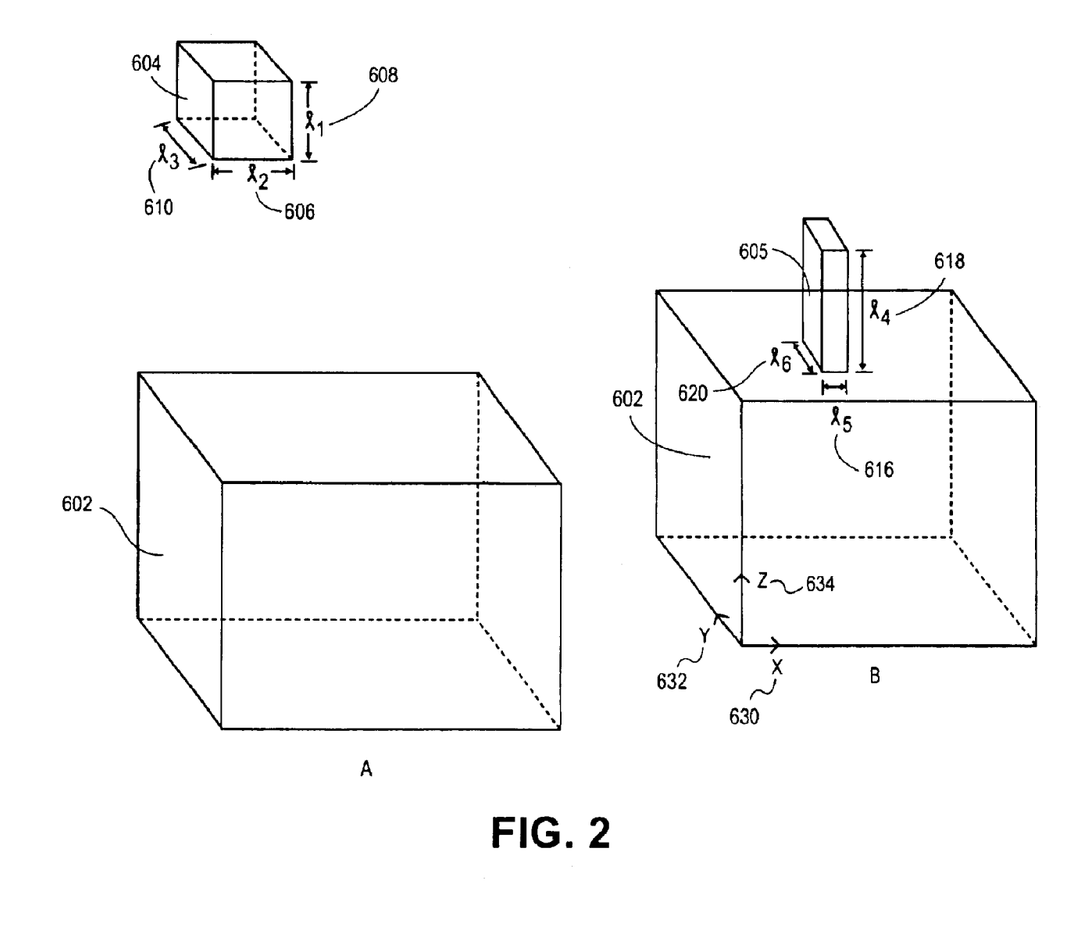
FIG. 2 is a view of a portion of a bulk material and a portion of a small material.

Referring now to FIG. 2 at "A" is shown bulk material 602 having a small lattice constant and small material 604 having a larger lattice constant than bulk material 602. Small material 604 has first dimension L1 608, second dimension L2 606, and third dimension L3 610.

In one embodiment, small material 604 is SiGe having 50% Si and 50% germanium, and bulk material 602 is silicon, where small material 604 has a 2% larger lattice constant than small material 602.

Referring now to FIG. 2 at "B", bulk material 602 is shown with strained small material 605. Strained small material 605 is strained since bulk material 602 has a smaller lattice constant than unstrained small material 604 (at "A"). Distance L2 606 is reduced to distance L5 616, distance L3 610 is reduced to distance L6 620, and distance L1 608 is increased to distance L4 618 (for materials with a positive Poisson's ratio).

In the embodiment where small strained material 605 is SiGe having 50% Si and 50% Ge, and bulk material 602 is Si, distance L5 616 is 2% smaller than distance L2 606, distance L6 620 is 2% smaller than distance L3 610, and for silicon having a Poisson's ratio of 0.17, distance L4 618 is 0.34% larger than distance L1 608.

Strained small material 605 can be used, for example, as a channel region in a PMOS transistor, having improved hole-flow in the x-direction 630 and Y-direction 632, as compared to unstrained small material 604. Alternatively, strained small material can be used as a channel region in an NMOS transistor having improved electron flow in Z-direction 634 as compared to unstrained small material 604.

Figure 3:
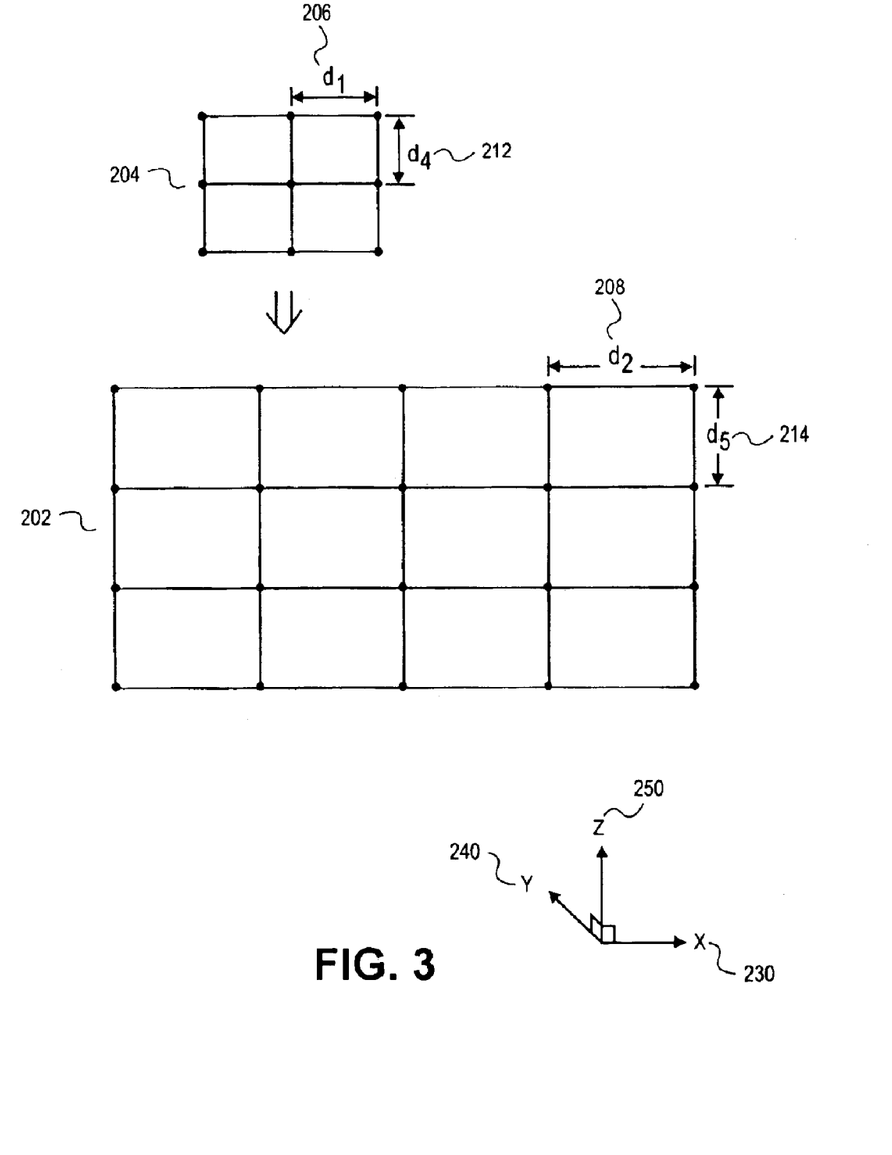
FIG. 3 shows a small lattice spacing small material and a bulk material.

FIG. 3 illustrates bulk material 202 and small material 204. "xyz" axes are illustrated at the bottom, with x axis 230, y axis 240, and z axis 250. Bulk material 202 has x-lattice spacing $d_2$ 208 and z-lattice spacing $d_5$ 214, while small material 204 has x-lattice spacing $d_1$ 206, and z-lattice spacing $d_4$ 212. As illustrated, bulk material 202 has x-lattice spacing $d_2$ 208 and z-lattice spacing $d_5$ 214 that is larger than small material 204 which has x-lattice spacing $d_1$ 206 and z-lattice spacing $d_4$ 212.

Figure 4:
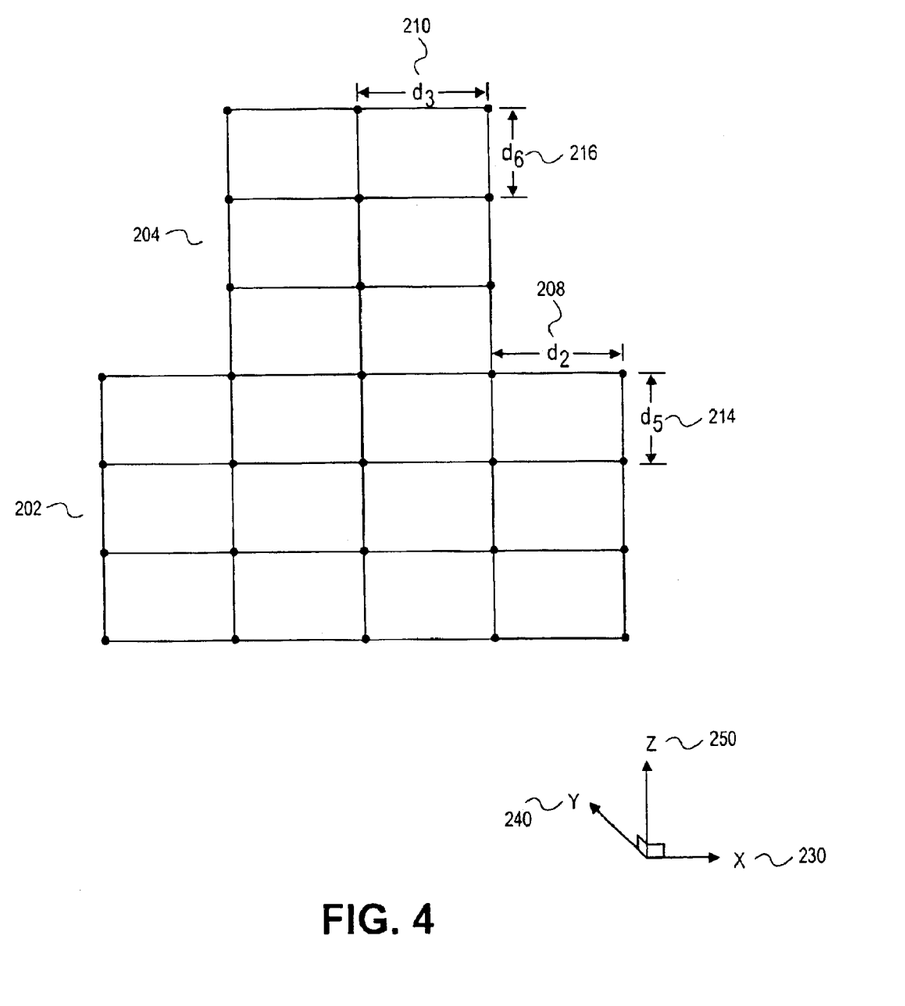
FIG. 4 shows a small lattice spacing small material and a bulk material.

Referring now to FIG. 4, small material 204 has been brought into contact with bulk material 202, for example, by epitaxial growth, bonding, heat-treatment, etc., such that the lattice of small material 204 has matched itself to the lattice of bulk material 202. As illustrated, x-lattice spacing $d_2$ 208 has remained substantially the same or decreased slightly, while x-lattice spacing $d_3$ 210 has been increased from x-lattice spacing $d_1$ 206 (see FIG. 3).

In contrast, z-lattice spacing $d_5$ 214 has remained substantially the same, while z-lattice spacing $d_6$ 216 has been decreased from z-lattice $d_4$ 212 (see FIG. 3). (None of the figures are drawn to scale, and are shown for illustrative purposes only.)

As illustrated in FIGS. 3 and 4, $d_2$ 208 has remained substantially the same, while x-lattice spacing $d_1$ 206 has increased from $d_1$ 206 in FIG. 3 to $d_3$ 210 in FIG. 4.

The strain in the x-direction placed on the lattice of small material 204 may be represented by the following equation:

$$E_x = \frac{d_3 - d_1}{d_1} \times 100\%$$

As illustrated in FIGS. 3 and 4, $d_5$ 214 has remained substantially the same in FIGS. 3 and 4, while the z-lattice spacing for small material 204 has decreased from $d_4$ 212 in FIG. 3 to $d_6$ 216 in FIG. 4.

The strain placed on the lattice of small material 204 in the z-direction may be represented by the following equation:

$$E_z = \frac{d_6 - d_4}{d_4} \times 100\%$$

The Poisson's ratio for small material 204 equals $$\frac{-E_z}{E_x}$$

In one embodiment, the strain in the x- and/or the z-direction is less than about 10%. In another embodiment, the strain in the x- and/or the z-direction is less than about 5%. In another embodiment, the strain in the x- and/or the z-direction is less than about 2%. In another embodiment, the strain in the x- and/or the z-direction is less than about 1%.

In one embodiment, small material 204 is silicon, and bulk material 202 is a material having x-lattice spacing $d_2$ 208 between about 0.5% and about 10% larger than silicon. In one embodiment, if x-lattice spacing $d_2$ 208 is more than about 10% larger than lattice spacing $d_1$ 206, then small material 204 may experience significant dislocations when small material 204 is brought into contact with bulk material 202 as illustrated in FIG. 4.

In another embodiment, bulk material 202 may be made of silicon (Si) doped with one or more of aluminum, galium, germanium, arsenic, indium, tin, antimony, thalium, lead, and/or bismuth. Amounts of the dopants will need to be adjusted in order to compensate for the relative size of silicon compared to the various dopants. For example, due to size differences, a large amount of aluminum is needed to dope silicon compared to a very small amount of bismuth, in order to achieve the same lattice spacing.

In another embodiment, small material 204 as shown in FIG. 3 has a lattice spacing in the x- and/or z-directions about 0.5 and about 0.6 nm, and bulk material has a larger lattice spacing in the x- and/or z-directions than small material 204 of about 0.51 to about 0.61 nm.

Figure 5:
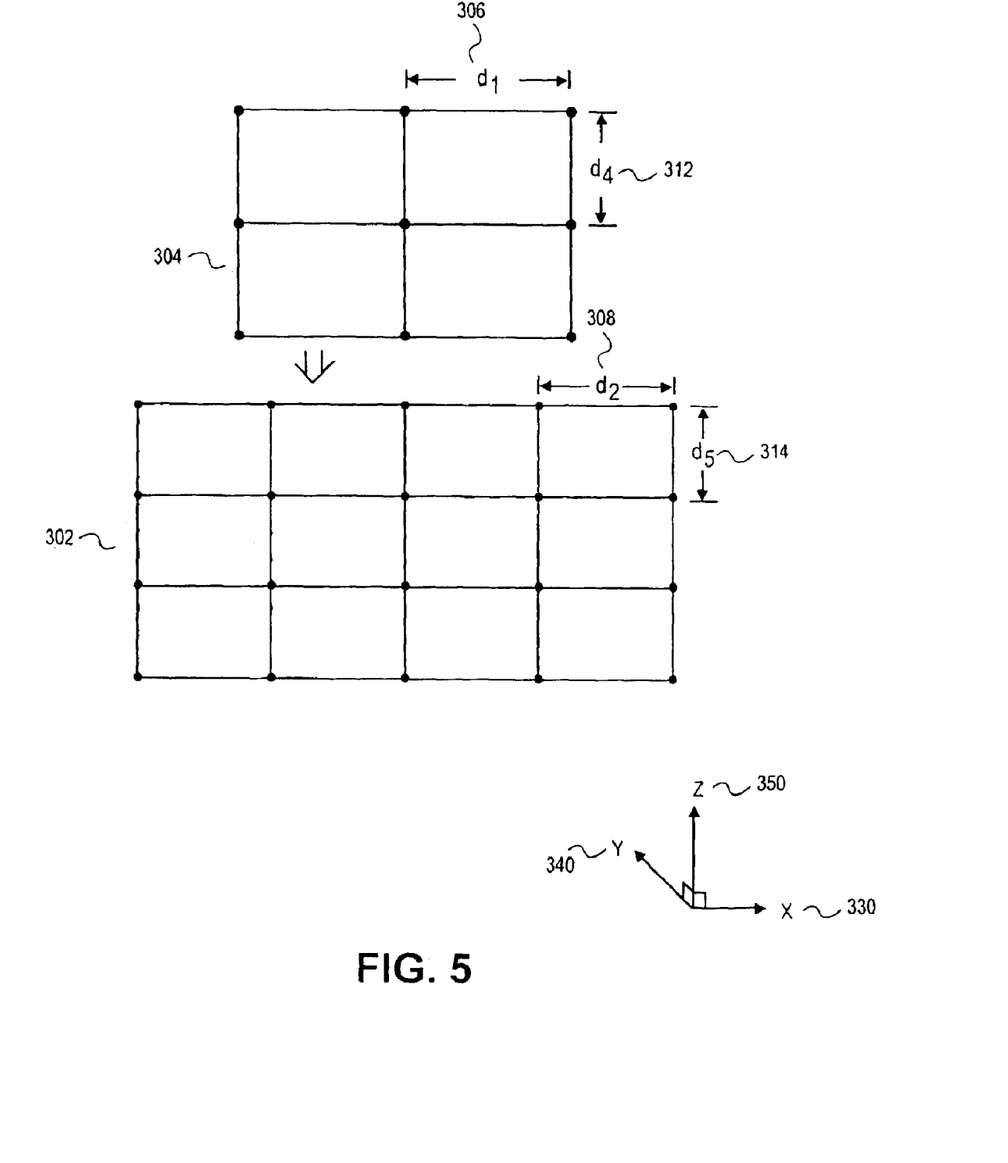
FIG. 5 shows a large lattice spacing small material and a bulk material.

Referring now to FIG. 5, there is illustrated small material 304 and bulk material 302. Also shown are xyz axes, x axis 330, y axis 340, and z axis 350. Small material 304 has x-lattice spacing $d_1$ 306, and z-lattice spacing $d_4$ 312. Bulk material 302 has x-lattice spacing $d_2$ 308, and z-lattice spacing $d_5$ 314. As shown in FIG. 5, x-lattice spacing $d_1$ 306 of small material 304 is larger than x-lattice spacing $d_2$ 308 of bulk material 302.

Figure 6:
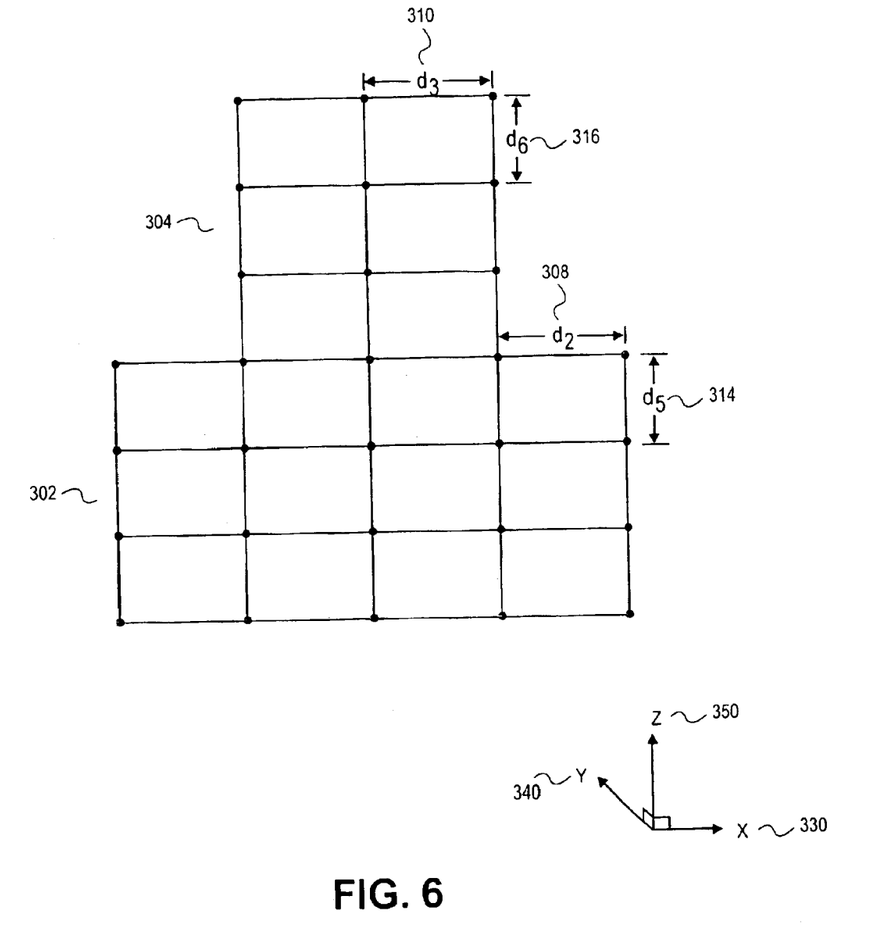
FIG. 6 shows a large lattice spacing small material and a bulk material.

Referring now to FIG. 6, small material 304 has been brought into contact with bulk material 302, so that lattice of small material 304 aligns with the lattice bulk material 302. X-lattice spacing $d_2$ 308 and z-lattice spacing $d_5$ 314 of bulk material have remained substantially the same from FIG. 5 to FIG. 6, while x-lattice spacing of small material 304 has been reduced from $d_1$ 306 in FIG. 5 to $d_3$ 310 in FIG. 6, and z-lattice spacing of small material 304 has been increased from $d_4$ 312 in FIG. 5 to $d_6$ 316 in FIG. 6.

In one embodiment, small material 304 is SiGe with Ge from about 10% to about 60%, and bulk material 302 is a material having an x- and/or a z-lattice spacing less than that of the small material, e.g., silicon.

In another embodiment, suitable materials for bulk material 302 include silicon doped with one or more of boron, carbon, nitrogen, and/or phosphorous. As discussed above, in order to obtain a given lattice spacing for bulk material 302, less boron would be needed than phosphorous, given their relative sizes.

In one embodiment, the strain experienced by small material 304 in the x-direction from FIG. 5 to FIG. 6 may be represented by the following equation:

$$E_x = \frac{d_3 - d_1}{d_1} \times 100\%$$

In another embodiment, the strain experienced by small material 304 in the z-direction from FIG. 5 to FIG. 6 may be represented by the following equation:

$$E_z = \frac{d_6 - d_4}{d_6} \times 100\%$$

In one embodiment, the x-direction and/or the z-direction strain is less than about 10%. In another embodiment, the x-direction and/or the z-direction strain is less than about 5%. In another embodiment, the x-direction and/or the z-direction strain is less than about 2%. In another embodiment, the x-direction and/or the z-direction strain is less than about 1%.

In one embodiment, if the x-direction and/or the z-direction strain is greater than about 10%, then there may be significant lattice dislocations in device body 304 when brought into contact with straining layer 302.

In another embodiment, device body 304 has a lattice spacing of between about 0.5 nm and 0.6 nm, and straining layer 302 has a smaller lattice spacing of between about 0.49 nm and about 0.59 nm.

In one embodiment, small material 204 and/or 304, has a thickness and/or a mass substantially less than bulk material 204 and/or 304. In another embodiment, bulk material 202 and/or 302 has a thickness and/or a mass of about ten times greater than small material 204 and/or 304.

Figure 7:
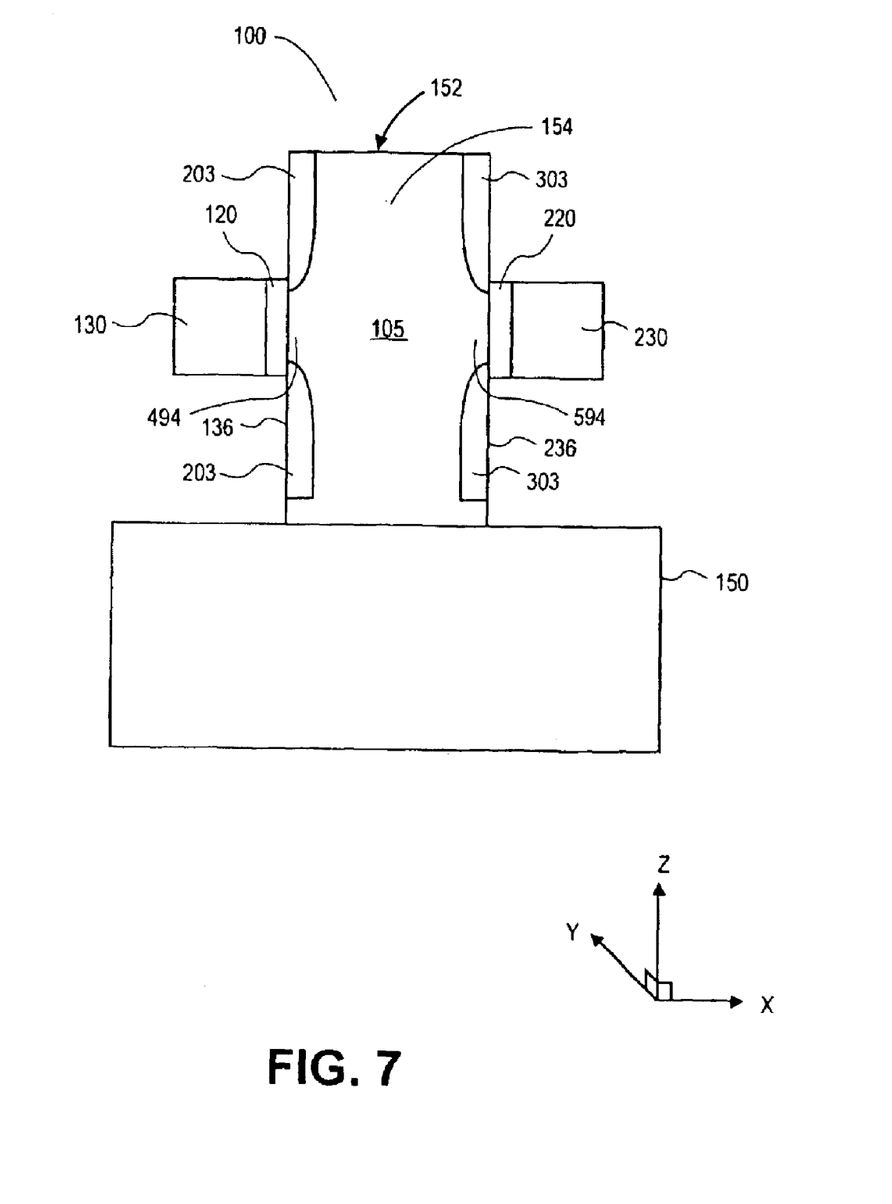
FIG. 7 shows a Type II double-gate device.

FIG. 7 is a cross-sectional view of a semiconductor device. Device 100 includes straining substrate 150 with double-gate fin transistor 152 extending therefrom. Fin transistor 152 includes P-type well 105. P-type well 105 is formed, such as, by introducing a dopant, such as boron and/or indium into body 154 of fin transistor 152. On first surface 136 of body 154 is formed first gate dielectric 120 and first gate electrode 130.

On second surface 236 of body 154 is formed second gate dielectric 220 and second gate electrode 230. In one embodiment, gate dielectrics are silicon dioxide ($SiO_2$) that is grown or deposited. In another embodiment, gate dielectrics may be a deposited high –K dielectric, e.g., $ZrO_2$ or $HfO_2$. Gate electrodes 130 and 230 may be formed, such as, by deposition (e.g., chemical vapor deposition (CVD)) on gate dielectrics 120 and 220. Gate electrodes 130 and 230 may each be deposited to a thickness of, for example, about 150 to about 2000 Å. Accordingly, the thickness of gate electrodes 130 and 230 are each scalable and may be selected or chosen based on integration issues related to device performance. Representatively, gate electrode material may be deposited as a blanket layer, then patterned into respective gate electrodes, then doped to form N-type or P-type materials. In one embodiment, gate electrodes 130 and 230 may be N-type.

Also illustrated are junction regions 203 and 303, for example, NMOS junctions, that may be formed by a junction implant (e.g., such as implanting with arsenic, phosphorous, and/or antimony for N-type junction regions), and possibly include additionally corresponding type tip implants. In one embodiment, junction regions 203 and 303 may be formed by doping portions of P-type well 105 to form those junction regions. Representatively, to form NMOS transistors, a dopant such as arsenic is implanted into gate electrodes 130 and 230 and junction regions 203 and 303. FIG. 7 illustrates are channels 494 and 594, for example, NMOS channels. In one embodiment, performances of channels 494 and 594 are increased by placing channels 494 and 594 in tensile strain.

In another embodiment, channels 494 and 594 may be placed in tensile strain by straining substrate 150 having a smaller lattice spacing than body 154. In one embodiment, body 154 is silicon or SiGe, and suitable materials for straining substrate include silicon doped with one or more of boron, carbon, nitrogen, and/or phosphorous. If straining substrate 150 has a smaller lattice spacing than body 154, then body 154 will be compressively strained in the x- and y-directions, and tensiley strained in the z-direction due to the Poisson's ratio of silicon. Therefore, current will flow through channels 494 and 594 in a direction of secondary strain, substantially orthogonal or substantially perpendicular to a plane of primary strain.

In another embodiment, FIG. 7 illustrates a PMOS device, having PMOS channels 494 and 594 whose performance may be increased by putting channels 494 and 594 in compression. Channels 494 and 594 may be put in compression if straining substrate 150 has a larger lattice spacing than body 154. In one embodiment, body 154 is made of silicon, and suitable materials for straining substrate 150 include silicon doped with one or more of aluminum, galium, germanium, arsenic, indium, tin, antimony, thalium, lead, and/or bismuth. In one embodiment, if straining substrate 150 has a lattice spacing greater than body 154, then body 154 will be tensiley strained in the x- and y-directions, and compressively strained in the z-direction due to Poisson's ratio. Therefore, current will flow through channels 494 and 594 in a direction of secondary strain, substantially orthogonal or substantially perpendicular to a plane of primary strain.

In one embodiment, straining substrate 150 comprises silicon germanium (SiGe) (for example, about 20% to about 60% germanium) and body 154 comprises silicon. In another embodiment, straining substrate 150 comprises carbon-doped silicon and body 154 comprises silicon.

In another embodiment, straining substrate 150 comprises a first material having a first lattice spacing, and body 154 comprises a second material having a second lattice spacing, where the first lattice spacing is larger than the second lattice spacing. In one embodiment, the first lattice spacing is between about 0.2% and about 2% larger than the second lattice spacing.

In another embodiment, straining substrate 150 comprises a first material having a first lattice spacing, and body 154 comprises a second material having a second lattice spacing, where the first lattice spacing is smaller than the second lattice spacing. In one embodiment, the first lattice spacing is between about 0.2% and about 2% smaller than the second lattice spacing.

In another embodiment, suitable materials that may be used for bulk materials 202 and/or 302, small materials 204 and/or 304, electrodes 130 and/or 230, body 154, and/or straining substrate 150 include one or more of the following: silicon (Si), silicon germanium (SiGe), silicon carbide (SiC), carbon-doped silicon, nickel silicide (NiSi), titanium silicide ($TiSi_2$), cobalt silicide ($CoSi_2$), and may optionally be doped with one or more of boron, indium, and/or aluminum.

In another embodiment, electrodes 130 and/or 230 may be formed or deposited by selective deposition, CVD deposition, and/or epitaxial deposition. For example, an epitaxial layer of single crystal semiconductor film may be formed upon a single crystal substrate, where the epitaxial layer has the same crystallographic characteristics as the substrate material, but differs in type or concentration of dopant. In another embodiment, electrodes 130 and/or 230 may be formed by selective CVD deposition, and possibly include epitaxial deposition of single crystal silicon alloy with the same crystal structure as that of the material onto which the structure is deposited (e.g., a similar or the same grade crystal grade, such as, 100, 110, etc.).

Suitable processes for forming or growing of silicon and silicon alloy materials include vapor phase (VPE), liquid phase (LPE), or solid phase (SPE) blocks of silicon processing. For example, one such CVD process that is applicable to VPE of silicon includes: (1) transporting reactants to the substrate surface; (2) reactants absorbed on the substrate surface; (3) chemical reaction on the surface leading to formation of a film and reaction products; (4) reaction products deabsorbed from the surface; and (5) transportation away of the reaction product from the surface.

In addition, suitable forming of silicon and silicon alloys comprises selective epitaxial deposition, formation, or growth known in the art as Type 1 selective epitaxial deposition. Using Type 1 deposition, silicon alloy deposition would be occurring only on bare silicon substrates within the openings of the oxide film, and minimal, if any, growth on the oxide.

Suitable selective epitaxial formation also includes Type 2 selective epitaxial deposition where selectivity of deposition is non-critical. Using Type 2 deposition, formation or growth of the silicon alloy occurs on bare silicon substrate, as well as on the oxide film, and thus when this type of deposition is made, an interface between the epitaxial layer of silicon alloy formed on the bare silicon substrate and a polysilicon layer of silicon alloy formed on the oxide film is created. The angle of this interface relative to the film growth direction depends on the crystallographic orientation of the substrate.

In another embodiment, Type 1 selective epitaxial deposition using a silicon source including one or more of the following: silicon, silicon germanium (SiGe), silicon carbide (SiC), nickel silicide (NiSi), titanium silicide ($TiSi_2$), cobalt silicide ($CoSi_2$), halides, $SiCl_4$, $SiHCl_3$, $SiHBr_3$, and $SiBr_4$ at suitable temperatures. Also, $SiH_2Cl_2$, $SiH_4$ may be used as a silicon source if hydrogen chloride (HCl), chlorine ($Cl_2$) is present.

In another embodiment, silicon and/or silicon alloy materials may be deposited, as described above, and then doped to form junction regions in accordance with the characteristics of a desired NMOS or PMOS device. For example, after deposition of a silicon and/or a silicon alloy material, one or both of those materials may be doped such as by doping those materials, as described above with respect to doping to form the P-type material of P-type well 105 and/or the N-type material of N-type well 115.

Suitable materials for straining substrate 150 include, for example, silicon, silicon germanium, doped silicon germanium, silicon carbide, silicon carbon, carbon doped silicon with lattice spacing different from the electrode, which can be deposited by an operation using one or more of CVD, epitaxial deposition, and/or selective deposition. Thus, for an NMOS device, a suitable material for straining substrate 150 has a lattice spacing smaller than that of fin transistor 152, and can be used to provide a tensile strain in channels 494 and 594.

On the other hand, for a PMOS device, a suitable material for straining substrate 150 has a lattice spacing that is larger than a lattice spacing of fin transistor 152, which can be used to cause a compressive strain in channels 494 and 594.

Various embodiments are described above. It will, however, be evident that various modifications and changes may be made thereto without departing from the broader spirit and scope of the claimed subject matter. The specification and drawings are, accordingly, to be regarded in an illustrative rather than a restrictive sense.

What is claimed:

1. An apparatus comprising:
    a straining substrate having a substrate surface;
    a device over the substrate surface including a channel;
    wherein one of a compressive strain and a tensile strain in the substrate in a direction parallel to the straining substrate surface strains the device with a strain opposite the one of a compressive strain and a tensile strain in a direction parallel to the substrate surface and in a direction substantially perpendicular to a direction of current flow in the channel.

2. The apparatus of claim 1, wherein the device is under a strain caused by a lattice spacing of the straining substrate.

3. The apparatus of claim 1, wherein the device comprises a material having a first lattice spacing that comprises a different lattice spacing than a second lattice spacing of the straining substrate.

4. The apparatus of claim 1, wherein the channel is under a compressive strain caused by the straining substrate having a first lattice spacing being a larger lattice spacing than a second lattice spacing of the channel.

5. The apparatus of claim 1, wherein the channel is under a tensile strain caused by the straining substrate having a first lattice spacing being a smaller lattice spacing than a second lattice spacing of the channel.

6. The apparatus of claim 1, wherein the straining substrate comprises a material selected from the group consisting of silicon (Si), silicon germanium ($Si_{y-x} Ge_x$), silicon carbide ($Si_{y-x} C_x$), nickel silicide (NiSi), titanium silicide ($TiSi_2$), and cobalt silicide ($CoSi_2$).

7. The apparatus of claim 1, the device further comprising a gate electrode and a layer of silicide material on the surface of a gate electrode, wherein the layer of silicide material comprises one of nickel suicide (NiSi), titanium suicide (TiSi$_2$), and cobalt suicide (CoSi$_2$).

8. The apparatus of claim 1, wherein the strain opposite the one of a compressive strain and a tensile strain strains the channel with a strain similar to the one of a compressive strain and a tensile strain in a direction substantially parallel to a direction of current flow in the channel.

9. The apparatus of claim 1, wherein the one of a compressive strain and a tensile strain in the substrate strains the device with a similar strain to the one of a compressive strain and a tensile strain in a direction perpendicular to the substrate surface and substantially parallel to a direction of current flow in the channel.

10. The apparatus of claim 9, wherein the one of a compressive strain and a tensile strain is a compressive strain, the similar type of strain is a compressive strain, and a height of the device is reduced according to Poisson's Ratio.

11. The apparatus of claim 9, wherein the one of a compressive strain and a tensile strain is a tensile strain, the similar type of strain is a tensile strain, and a height of the device is increased according to Poisson's Ratio.

12. An apparatus comprising:
a straining substrate;
a device over the substrate including a gate electrode, and a first junction region and a second junction region adjacent the gate electrode; and
the straining substrate having a lattice spacing that is different than a lattice spacing of the device, wherein the device is adapted to have a current flow substantially perpendicular to a surface of the straining substrate.

13. The apparatus of claim 12, wherein the straining substrate comprises a lattice spacing that is larger than the lattice spacing of the device, adapted to impart a compressive strain in the current flow direction.

14. The apparatus of claim 12, wherein the lattice spacing of the straining substrate is smaller than the lattice spacing of the device, adapted to impart a tensile strain in the current flow direction.

15. The apparatus of claim 12, wherein the straining substrate comprises silicon germanium having a lattice spacing that is larger than the lattice spacing of the device, adapted to impart a compressive strain in the current flow direction.

16. The apparatus of claim 12, wherein the straining substrate causes a strain in a direction of the current flow that is similar to a strain in the substrate in a direction parallel to the surface of the straining substrate.

17. A method comprising:
forming a device on a straining substrate surface, the device including:
a gate electrode;
a first junction region and a second junction region adjacent the gate electrode; and
wherein a strain of the straining substrate in a direction parallel to the substrate surface causes an opposite and primary strain in the device in a first direction parallel to the substrate surface, and a similar and secondary strain in a second direction substantially perpendicular to the substrate surface; and
flowing a current in a direction substantially parallel to the second direction.

18. The method of claim 17, wherein the primary strain is tensile and the secondary strain is compressive.

19. The method of claim 17, wherein the primary strain is compressive and the secondary strain is tensile.

20. The method of claim 17, wherein the secondary strain causes a height of the device to be changed according to Poisson's Ratio.

* * * * *